(12) United States Patent
Schauwecker et al.

(10) Patent No.: US 6,563,316 B2
(45) Date of Patent: May 13, 2003

(54) MAGNET ARRANGEMENT COMPRISING AN ACTIVELY SHIELDED SUPERCONDUCTING MAGNET COIL SYSTEM AND AN ADDITIONAL CURRENT PATH FOR STRAY FIELD SUPPRESSION IN CASE OF A QUENCH

(75) Inventors: Robert Schauwecker, Zurich (CH); Pierre-Alain Bovier, Zurich (CH); Andreas Amann, Zurich (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 09/986,249

(22) Filed: Nov. 8, 2001

(65) Prior Publication Data

US 2002/0101239 A1 Aug. 1, 2002

(30) Foreign Application Priority Data

Dec. 5, 2000 (DE) .......................................... 100 60 284

(51) Int. Cl.[7] ................................................. G01V 3/00
(52) U.S. Cl. ...................................... 324/318; 324/322
(58) Field of Search ............................... 324/318, 322, 324/309, 307; 335/301, 316; 307/91

(56) References Cited

U.S. PATENT DOCUMENTS

| | | |
|---|---|---|
| 3,304,466 A | 2/1967 | Minnich |
| 3,668,581 A | 6/1972 | Schrader |
| 5,644,233 A | 7/1997 | Bird ........................... 324/318 |
| 6,265,960 B1 * | 7/2001 | Schauwecker et al. ...... 335/301 |
| 6,369,464 B1 * | 4/2002 | Schauwecker et al. ........ 307/91 |
| 6,476,700 B2 * | 11/2002 | Schauwecker et al. ...... 335/216 |
| 6,496,091 B2 * | 12/2002 | Schauwecker et al. ...... 335/216 |

* cited by examiner

*Primary Examiner*—Edward Lefkowitz
*Assistant Examiner*—Brij B. Shrivastav
(74) *Attorney, Agent, or Firm*—Paul Vincent

(57) ABSTRACT

A magnet arrangement comprising an actively shielded superconducting magnet coil system (M) and a plurality of protective elements (R1, . . . , Rl) for protection in case of a quench, wherein the superconducting magnet coil system (M) comprises a radially inner partial coil system (C1) and a radially outer partial coil system (C2) which are electrically connected in series and arranged coaxially with respect to one another and which each produce a magnetic field of opposite direction, wherein the superconducting current path of the magnet coil system (M) is subdivided into several sections (A1, . . . , An) each of which is electrically connected in parallel with at least one of the protective elements (R1, . . . , Rl), and wherein at least one of these sections (A1, . . . , An) comprises windings of the radially inner partial coil system (C1) and also windings of the radially outer partial coil system (C2), is characterized in that at least one additional closed current path (C3) is provided which has a non-vanishing areal winding number and which has a non-zero inductive coupling $L_{Ai \leftrightarrow C3}$ with at least one section Ai. This permits—in particular through selection of the dimensions of the additional current path (C3)—suppression of an excess stray field of the magnet arrangement in the case of a quench of the magnet coil system (M).

26 Claims, 2 Drawing Sheets

MAGNET ARRANGEMENT COMPRISING AN ACTIVELY SHIELDED SUPERCONDUCTING MAGNET COIL SYSTEM AND AN ADDITIONAL CURRENT PATH FOR STRAY FIELD SUPPRESSION IN CASE OF A QUENCH

This application claims Paris Convention priority of DE 100 60 284.3 filed Dec. 5, 2000 the complete disclosure of which is hereby incorporated by reference

BACKGROUND OF THE INVENTION

The invention concerns a magnet arrangement comprising an actively shielded superconducting magnet coil system for generating a magnetic field in the direction of a z axis in a working volume disposed on the z axis about z=0, and with a plurality of protective elements for protecting the superconducting magnet coil system in the case of a breakdown in the superconducting state thereof (=quench), wherein the superconducting magnet coil system comprises a radially inner partial coil system and a radially outer partial coil system which are electrically connected in series, arranged coaxially with respect to one another, and which each produce a magnetic field in the working volume, of opposite directions along the z axis, wherein the superconducting current path of the magnet coil system is divided into several sections which are each electrically connected in parallel with at least one of the protective elements, wherein at least one of these sections comprises windings of the radially inner partial coil system and windings of the radially outer partial coil system.

U.S. Pat. No. 5,644,233 discloses a magnet arrangement comprising an actively shielded magnet coil system with a radially inner and a radially outer partial coil system, wherein the magnet coil system is divided into several sections each comprising windings of the inner partial coil system and windings of the outer partial coil system, such that the dipole moment of each of these sections is approximately zero, wherein each of the sections is connected in parallel with a protective element.

Superconducting magnets are used for different applications including, in particular, high field applications, e.g. for magnetic resonance methods. High field magnets of this type generally produce a considerable stray field which can be dangerous for the surroundings of the magnet. This problem can be solved by providing the magnet with an active shielding, i.e. with an additional superconducting coil which is connected in series with the main coil of the magnet, however, which produces a field of opposite polarity.

In addition to strong stray fields, another problem with superconducting high field magnets is the risk of a sudden breakdown of the superconducting state (=quench). To protect the superconducting wire of the magnet from overheating and from being destroyed in case of a quench, superconducting magnets usually comprise a device which diverts the magnetic current from the coil sections which have become resistive during a quench and through protective elements, e.g. resistances. For actively shielded magnets, such a quench protection device can cause the following problem: Should e.g. the shielding coil quench, the current flows away from the shielding via the protective elements connected in parallel while substantially the same original magnet current continues to flow in the main coil. This causes an extremely large short-term increase in the stray field of the magnet arrangement compared to the stray field during normal operation.

In an arrangement in accordance with U.S. Pat. No. 5,644,233, the problem of a possibly excessive stray field during a quench is solved in that each coil section, connected in parallel with its own common protective element, is composed of parts of the main coil and the shielding coil such that the dipole moment of each section during operation is small. If a quench occurs in such a section thereby locally reducing the current, the dipole moment of the magnet arrangement will, at most, change slightly. For this reason, the stray field cannot increase considerably.

However, it is not always possible to provide all coil sections bridged by protective elements with negligible dipole moments, in particular, for high field magnets. There are two main reasons therefore. Firstly, for each section, a superconducting connection must be provided between the parts of the main coil and the shielding portions. This is difficult to realize when the magnet is finely divided into many sections. Secondly, the dipole moments of the main coil and shielding portions cannot be exactly matched to each other since the beginning and end of the sections cannot lie within a winding packet but only at the end of an entire coil layer. Therefore, typical high field magnets unavoidably have at least some of the sections bridged with protective elements which have a dipole moment which is considerably different from zero. This can cause a considerable change in the stray field of the magnet arrangement during a quench in one of these sections.

In contrast thereto, it is the object of the present invention to considerably reduce the danger of an excess stray field during a quench in a magnet arrangement having at least one section which is bridged with a protective element and which has a non-negligible dipole moment.

SUMMARY OF THE INVENTION

This object is achieved in accordance with the invention in that at least one additional closed current path is provided which has a non-vanishing areal winding number and a non-zero inductive coupling $L_{Ai \leftrightarrow C3}$ to at least one section $A_i$, in particular, such that the coupling coefficient $$K_i = \frac{L_{Ai \leftrightarrow C3}}{\sqrt{L_{Ai} L_{C3}}}$$

is larger than 0.01, wherein $L_{Ai}$ and $L_{C3}$ characterize the self-inductances of the section Ai and of the additional current path C3, respectively.

The dipole moments of the sections bridged by a protective element are reduced as much as possible through combination of coil portions from the main coil and the shielding coil. Moreover, an additional current path with a non-vanishing areal winding number is also provided which is separate from the magnet coil system and which is inductively coupled to at least one of those sections whose dipole moment clearly differs from zero. In case of a quench in one of these sections, a current is induced in the additional current path which compensates for the change in the dipole moment of the magnet arrangement occurring during a quench, thereby keeping the stray field largely constant, or even reducing it, during the quench.

The advantage of an inventive arrangement consists in that, when forming the sections bridged with a protective element, the dipole moments of the sections must not necessarily be completely negligible, good protection from excess stray fields during a quench of the magnet arrangement is nevertheless still ensured. This permits a more flexible design of the quench protection device to facilitate production thereof or it can be dimensioned to provide optimum protection for the coil with regard to overheating during a quench.

One embodiment of the inventive magnet arrangement is particularly advantageous wherein the radially inner and outer partial coil systems have approximately equal magnetic dipole moments of opposite sign. Such a magnet arrangement has optimum magnetic shielding (i.e. a very small stray field) due to the substantially negligible magnetic dipole moment of the overall system. In such an arrangement, it would be particularly difficult to maintain the low stray field values during a quench, solely through suitable selection of the sections bridged by a protective element.

In one advantageous embodiment of the inventive magnet arrangement, the magnet arrangement is part of an apparatus for high-resolution magnetic resonance spectroscopy. In such magnet arrangements, the radially inner partial coil system generally has a very large dipole moment due to the required high field strengths, and therefore, the use of actively shielded magnet systems is particularly beneficial. The inventive arrangement guarantees that there are no excess stray fields in case of a magnet coil system quench, which would be particularly unfavorable in this case due to the generally large dipole moment of the main coil.

In a particularly preferred embodiment of the inventive magnet arrangement, the additional current path is formed by an additional coil system which is not electrically connected with the magnet coil system and which is arranged coaxially thereto. Selection of an additional coil system permits maximum flexibility when dimensioning the additional current path, thereby achieving optimum protection against excess stray field during a quench of the magnet coil system.

In a further preferred embodiment of the inventive magnet arrangement, the additional current path consists of a part of the magnet coil system bridged with an additional switch. This provides protection against excess stray fields during a quench without requiring large manufacturing effort.

In one advantageous embodiment of the inventive magnet arrangement, the additional current path has a small ohmic resistance R3, preferably such that the time constant of the additional current path $L_{C3}/R3$ is longer than one second—wherein $L_{C3}$ is the self-inductance of the additional current path. This guarantees slow reduction of current induced in the additional current path with, however, a time constant which is much larger than the typical time constant of a quench of the magnet coil system, thereby ensuring compensation of the magnetic dipole moment change during a quench.

In a further advantageous embodiment of the inventive magnet arrangement, the additional current path is superconducting. This variant has the advantage that the currents induced during a quench are not reduced before the entire magnet arrangement has quenched.

In one advantageous embodiment of the inventive magnet arrangement, the additional current path comprises a device for limiting the current induced therein. This prevents possible induction of excessive current in the additional current path, which could damage same.

Three further advantageous embodiments of the inventive magnet arrangement are characterized in that the additional current path is part of a device which provides the magnet arrangement with an additional function. This additional function can be, in particular, a drift compensation of the magnetic field of the magnet arrangement in the working volume, a shim device or compensation of external magnetic field fluctuations. This double function of these embodiments advantageously permits more compact design of the overall magnet arrangement.

A particularly preferred embodiment of the inventive magnet arrangement is characterized in that the additional current path is inductively decoupled from the magnet coil system. This is advantageous in that, when charging or decharging the magnet coil system, no current is induced in the additional current path and after a quench of the magnet coil system, no residual current flows in the additional current path even if the additional current path is superconducting.

In a further particularly preferred embodiment of the inventive magnet arrangement, at least one of the sections having an inductive coupling with the additional current path which is substantially different from zero, also has a magnetic dipole moment substantially different from zero, wherein the current which is induced in the additional current path in case of a quench in this section, produces a magnetic dipole moment which corresponds substantially to that of this section before the quench. This guarantees that the magnetic dipole moment of the magnet arrangement—and therefore its stray field—is maintained during a quench in this section.

In a particularly preferred further development of the above embodiment, the additional current path is superconducting and thermally decoupled from at least one of the sections. The amount of heat transferred to the additional current path during a quench in this section is therefore small.

In a particularly advantageous embodiment, an amount of heat transferred to the additional current path is not more than 50% of that amount of heat required in the additional current path for triggering a quench. This embodiment is of particular interest if the section thermally decoupled from the additional current path has a substantial magnetic dipole moment which is transferred to the additional current path through inductive coupling during a quench. In this case, one guarantees that the magnetic dipole moment produced by the additional current path is not removed by a quench of the additional current path produced by thermal coupling with the quenching section, since this would lead to an increase in the stray field of the magnet arrangement.

Another preferred further development of the inventive magnet arrangement is characterized in that the additional current path is superconducting and thermally coupled to at least one of the sections, preferably such that the amount of heat transferred to the additional current path during a quench corresponds to at least twice the amount of heat required for triggering a quench in the additional current path. This embodiment is of particular interest if the section which is thermally coupled to the additional current path has a negligible magnetic dipole moment and a substantially negligible inductive coupling with the additional current path. This guarantees that, during a complete quench of the magnet coil system, the additional current path also quenches thereby suppressing generation of a stray field.

In a further embodiment of the magnet arrangement, at least one of the sections consists mainly of windings of the radially inner partial coil system or mainly of windings of the radially outer partial coil system, and preferably such that this section consists only of windings of either the radially inner partial coil system or of the radially outer partial coil system. In this embodiment, the particularly sensitive sections of the magnet coil system—e.g. the radially innermost windings of the high field magnets—are advantageously optimally protected. In these cases, the formation of several smaller sections which exclusively comprise windings of the radially inner partial coil system is desirable.

In another particularly preferred further development of the inventive magnet arrangement, the magnet arrangement additionally comprises a passive magnetic material shielding. This permits suppression of stray field fluctuations generated during a quench, thereby enhancing the stray field-reducing effect of the inventive arrangement.

In a particularly preferred embodiment of the inventive magnet arrangement, the passive shielding is an integral component of a cryostat in which the magnet coil system is located. The constructive integration of the passive shielding in the cryostat permits more compact design of the overall magnet arrangement.

In another preferred further development of the inventive magnet arrangement, the passive shielding is not completely magnetically saturated during operation of the magnet coil system. This guarantees that the remaining additional possible magnetization of the passive shielding can be used to compensate for an excessive stray field generated during a quench.

In a particularly preferred embodiment of the inventive magnet arrangement, the passive shielding consists of ferromagnetic material, in particular of soft iron. The high permeability, high saturation magnetization, good commercial availability and low price of soft iron permits production of a very inexpensive and effective additional protection from excess stray fields during a quench of the magnet arrangement.

In one last advantageous embodiment, the passive shielding is disposed radially beyond the radially outermost winding of the magnet coil system (M).

Further advantages of the invention can be extracted from the description and the drawing. The features mentioned above and below can be used in accordance with the invention either individually or collectively in any arbitrary combination. The embodiments shown and described are not to be understood as exhaustive enumeration, rather have exemplary character for describing the invention.

The invention is shown in the drawing and further explained by means of embodiments.

DESCRIPTION OF THE PREFERRED EMBODIMENT

Figure 1:
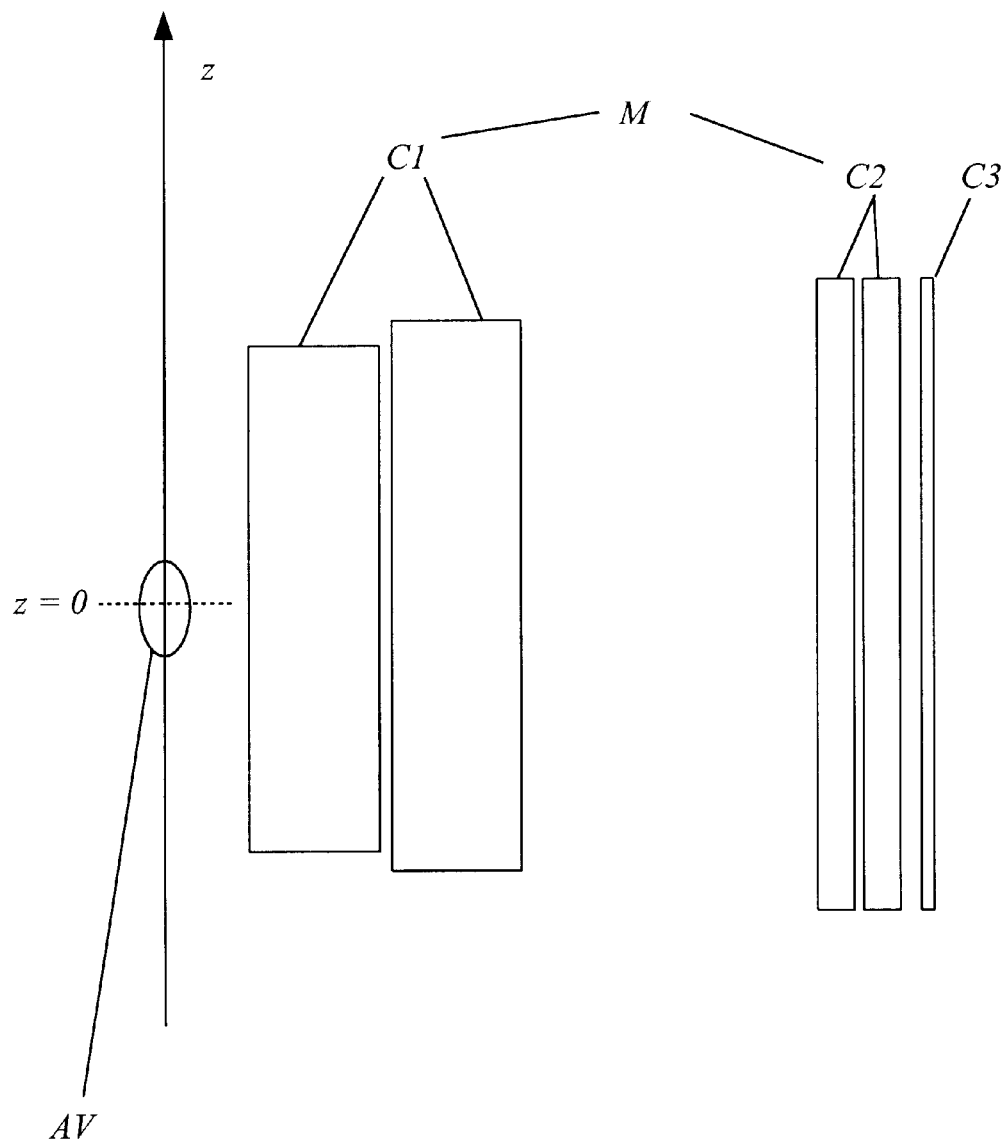
FIG. 1 shows a schematic vertical section through a radial half of the inventive magnet arrangement.

FIG. 1 shows an inventive magnet arrangement disposed about a working volume AV which comprises a magnet coil system M having a radially inner and a radially outer coaxial partial coil system C1 and C2 and an additional current path in the form of an additional coil system C3.

Figure 2:
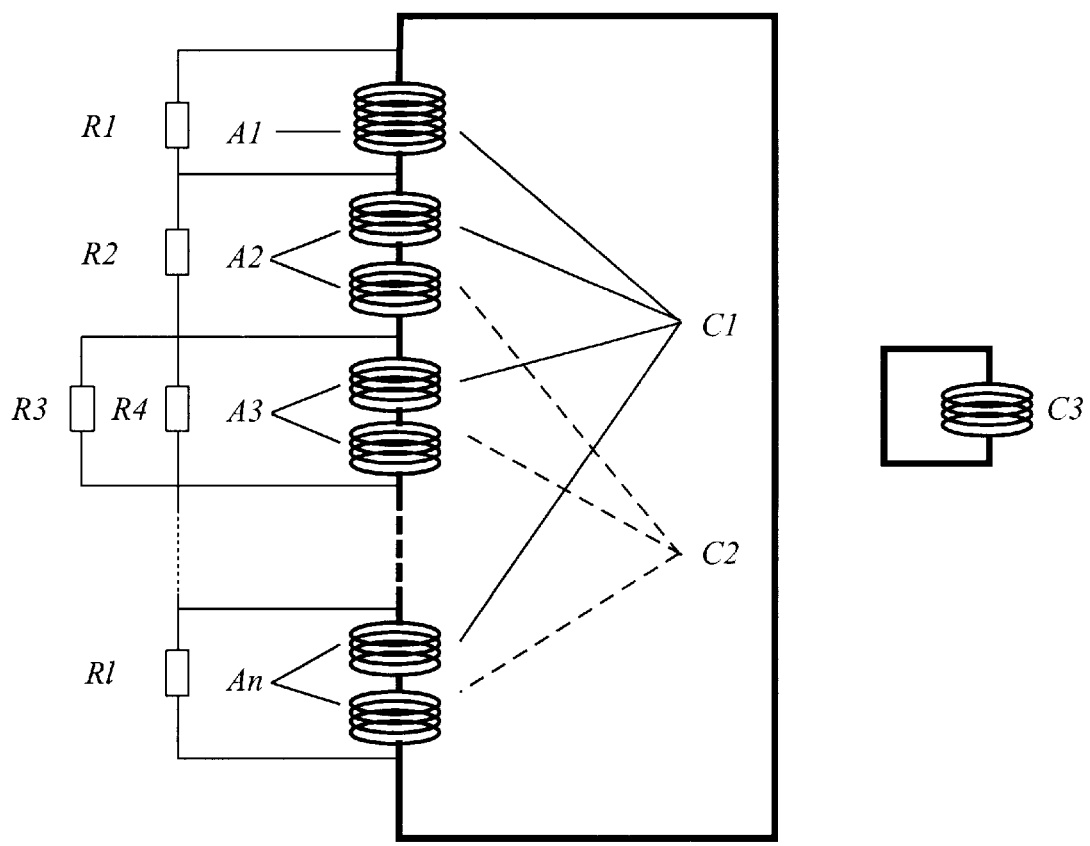
FIG. 2 shows a wiring diagram of an inventive magnet arrangement comprising coil sections A1, . . . , An and protective elements R1, . . . , Rl connected in parallel thereto.

FIG. 2 schematically shows the wiring of an inventive magnet arrangement. In particular, the magnet coil system M is divided into several sections A1, . . . An with which the protective elements R1, . . . , Rl are connected in parallel. The additional current path C3 is embodied by an additional coil system, separate from the magnet coil system M.

The invention is explained below by means of two embodiments of a superconducting actively shielded magnet arrangement, each of which produces a magnet field of 9 Tesla in the working volume AV. Niob titanium is used as the superconducting material. The magnet is operated in a liquid helium bath at a temperature of 4.2 Kelvin.

The first magnet arrangement (embodiment "V1" below) comprises a magnet coil system M having a radially inner partial coil system C1 and a radially outer partial coil system C2. C1 consists of two concentric, coaxial solenoid coils C1a and C1b having the same polarity, and C2 consists of one single solenoid coil arranged concentrically and coaxially to C1 and having a polarity opposite to that of C1. The embodiment V1 is therefore an actively shielded magnet coil system. The magnetic current for this arrangement is 81.8 ampere and the free inner bore has a diameter of 70 millimeters.

An inventive variant ("V2" below) is compared with variant V1, the inventive variant comprising an additional current path C3 in the form of a further coil system, in addition to the magnet coil system M. In the present example, the magnet coil system M is identical to that of variant V1, and C3 consists of a two-layered solenoid coil which is wound directly onto the outermost layer of C2. This additional solenoid coil is inductively decoupled from the magnet system M and can be used e.g. also as BO shim having a strength of 2.5 millitesla per ampere.

Table 1 shows a comparison among the most important features of the partial coil systems C1 (C1a and C1b), C2 and of the additional current path C3.

TABLE 1

|  | C1a | C1b | C2 | C3 |
| --- | --- | --- | --- | --- |
| ri [millimeters] | 38.0 | 63.5 | 238.3 | 241.8 |
| ra [millimeters] | 58.5 | 107.2 | 241.8 | 243 |
| L [millimeters] | 380 | 380 | 400 | 400 |
| W | 361 | 468 | 621 | 621 |
| N | 26 | 62 | 6 | 2 | in Table 1:
ri inner radius of the solenoid coil
ra outer radius of the solenoid coil
L length of the solenoid coil
W number of wire windings on each layer of the solenoid coil
N number of wire layers of the solenoid coil To protect the magnet arrangements V1 and V2 from wire damage in case of a quench, the partial coil systems C1 and C2 are divided into sections which are bridged with a protective element. The protective elements contact the superconductor of the superconducting coil systems at the coil end which also contains the inputs and outputs for the superconducting wire. This is advantageous from a manufacturing point of view, since the wires connecting the superconductor with the protective elements must not be guided out from the middle of the winding packet, which would be complicated. This means, however, that only every other layer can be used for the subdivision into sections. The windings of the shielding coil C2, comprising six layers in the magnet arrangements V1 and V2, can thus be distributed over a maximum of three different sections.

To prevent excess stray fields during a quench in the system according to U.S. Pat. No. 5,644,233, the sections bridged with protective elements must each have windings from the main coil system C1 and the shielding coil system C2 such that the dipole moment of the individual sections is substantially zero. In accordance with this prior art, a maximum of three coil sections, bridged with protective elements, can be formed in the magnet arrangements V1 and V2, since the shielding coil C2 does not permit a subdivision into more parts.

To permit optimum function of the protective device, the coil should preferably be subdivided into even more sections. The smaller the sections bridged with protective elements, the smaller their self-inductance and the faster the current reduction in a quenched section. This minimizes the danger of local wire damage due to overheating ("hot spot").

Quench protection devices (e.g. U.S. Pat. No. 5,644,233), optimized with respect to preventing an excess stray field during a quench, do not offer optimum protection, since the section subdivisioning is too coarse. This is symptomatic for superconducting high field magnets. In the example of the magnet arrangements V1 and V2, optimum coil protection requires considerably more than three sections bridged with protective elements. However, the goal of stray field suppression during a quench would then no longer be achieved, since it would no longer be possible to provide all sections with windings of the main coil C1 and of the shielding coil C2. With the examples of the magnet arrangements V1 and V2, the sections are selected such that the windings of the partial coil C1$b$ are distributed among three sections, with each of these sections also comprising two wire layers from the shielding coil C2. The partial coil C1$a$ forms a fourth section which contains no windings from the shielding C2 (see table 2). The sectional subdivisioning of the partial coil system C1$b$ is determined by minimizing the stray fields of the three sections. Although, in practice, a finer coil subdivisioning would be better, subdivision into a total of four sections produces a simple arrangement which provides a good illustration of the problem of excessive stray field during a quench and the inventive solution to that problem. Without additional means (variant V1) this arrangement poses the risk of a highly excessive stray field if a quench occurs in the partial coil C1$b$ which is not immediately thermally transferred to the partial coil C1$a$. In this case, the full stray field of the partial coil C1$a$ becomes temporarily visible. That field can become substantially larger than the stray field of the overall magnet arrangement during operation, in particular due to the excess current in the partial coil C1$a$ in case of a quench in the partial coil C1$b$.

This danger is avoided in the inventive magnet arrangement V2 in that a current is induced in the additional current path C3 which compensates for the stray field of the still superconducting partial coil C1$a$. The provision of the additional current path C3 thereby maintains stray field suppression during a quench without compromising the protective effect of the quench protective device, which, in turn, would be unavoidable in the solution of prior art due to an insufficiently fine sectional subdivisioning.

Since the additional current path C3 is inductively decoupled from the overall magnet arrangement, the current induced in C3 will be completely reduced as soon as the partial coil C1$a$ has also quenched. In this fashion, one can be assured that, after complete quenching of the magnet, there is no residual current in the additional current path C3. A similar effect could e.g. also be achieved with a small resistance in the additional current path C3 or with a current limiter.

Table 2 shows the subdivision of the magnet coil system M into the four sections A1, . . . , A4.

TABLE 2

| Section | |
|---|---|
| A1 | C1a (layers 1–26) |
| A2 | C1b (layers 1–26) & C2 (layers 1–2) |
| A3 | C1b (layers 27–46) & C2 (layers 3–4) |
| A4 | C1b (layers 47–62) & C2 (layers 5–6) |

The behavior of the magnet arrangements V1 or V2 during a quench will be quantitatively described below for two different scenarios.

To calculate the currents induced in the individual sections or in C3 during a quench, we need the inductance matrix of the described arrangement. This is given by:

$$\begin{bmatrix} L_{A1} & L_{A1\leftrightarrow A2} & L_{A1\leftrightarrow A3} & L_{A1\leftrightarrow A4} & L_{A1\leftrightarrow C3} \\ L_{A1\leftrightarrow A2} & L_{A2} & L_{A2\leftrightarrow A3} & L_{A2\leftrightarrow A4} & L_{A2\leftrightarrow C3} \\ L_{A1\leftrightarrow A3} & L_{A2\leftrightarrow A3} & L_{A3} & L_{A3\leftrightarrow A4} & L_{A3\leftrightarrow C3} \\ L_{A1\leftrightarrow A4} & L_{A2\leftrightarrow A4} & L_{A3\leftrightarrow A4} & L_{A4} & L_{A4\leftrightarrow C3} \\ L_{A1\leftrightarrow C3} & L_{A2\leftrightarrow C3} & L_{A3\leftrightarrow C3} & L_{A4\leftrightarrow C3} & L_{C3} \end{bmatrix} =$$

$$\begin{bmatrix} 1.65 & 2.20 & 1.58 & 1.18 & 0.16 \\ 2.20 & 5.98 & 4.70 & 3.50 & -0.10 \\ 1.58 & 4.70 & 5.12 & 4.09 & -0.04 \\ 1.18 & 3.50 & 4.09 & 4.12 & -0.02 \\ 0.16 & -0.10 & -0.04 & -0.02 & 0.57 \end{bmatrix} \text{Henry,}$$

wherein the matrix elements which describe couplings with C3 are only relevant for the embodiment V2. Although, as can be gathered from the above values, the current path C3 is inductively decoupled from the overall magnet coil system M in the embodiment V2, it does have relatively strong couplings to the individual sections. Since the resistance in a respective section rises dramatically in case of a quench due to the breakdown of the superconductivity in parts of the coil system, nearly the entire magnetic current will flow across the protective elements connected in parallel with this section. To calculate the maximum occurring stray fields, three quench scenarios must be observed, wherein, in each scenario, one of the three solenoid coils C1$a$, C1$b$ or C2 has completely quenched. Through selection of the sections, two of these cases (C1$b$ quenches or C2 quenches) are identical, since, in both cases, current can only flow in the partial coil system C1$a$ (and—if present—in the additional coil system C3).

Table 3 shows a comparison of the maximum stray fields of the two embodiments V1 and V2 during operation as well as for the two different quench scenarios.

TABLE 3

| | State of operation | Quench in C1a | | Quench in C1b or C2 | |
|---|---|---|---|---|---|
| | V1 & V2 | V1 | V2 | V1 | V2 |
| R5G [meters] | 0.95 | 0.90 | 0.95 | 1.65 | 0.71 |
| B95 [millitesla] | 0.5 | 0.4 | 0.5 | 2.5 | 0.2 |

In table 3:
R5G is the distance from the magnet axis at which the field strength falls below 0.5 millitesla.
B95 is the maximum amount of field strength of the magnet arrangement on a coaxial cylindrical surface having a radius of 0.95 meters.

The region inside the distance R5G from the magnet axis must generally be kept free from magnetic field sensitive devices and magnetic materials. During operation of the magnet arrangements V1 and V2, this distance is 0.95 meters. It is therefore decisive that the field strength of 0.5 millitesla at this distance from the magnet axis is not exceeded during a quench of the magnet arrangement. This requirement is not met in the embodiment V1 during a quench in the solenoid coil C1$b$ or C2. The stray field can increase up to five times its normal value and only falls below the threshold value of 0.5 millitesla beyond a distance of 1.65 meters from the magnet axis. In contrast thereto, there is no stray field increase at all in the variant V2 in accordance with the invention.

We claim:

1. A magnet configuration having an actively shielded superconducting magnet coil system for generating a magnetic field in a direction of a z axis in a working volume disposed on the z axis about z=0, the configuration comprising:
   a radially inner partial coil system;
   a radially outer partial coil system, said radially inner and outer coil systems being electrically connected in series and arranged coaxially with respect to each other, each of said inner and outer coil systems generating a magnetic field of opposite direction along the z axis in the working volume;
   a plurality of protective elements for protecting the superconducting magnet coil system in case of a superconductivity breakdown or quench, wherein the magnet coil system defines a superconducting current path which is divided into sections (A1, . . . , An) each of which is electrically connected in parallel to at least one of said protective elements, with at least one of said sections having windings of said radially inner and said radially outer partial coil systems; and
   at least one additional closed current path (C3) said additional path having a non-vanishing areal winding number and a non-zero inductive coupling $L_{Ai \leftrightarrow C3}$ to at least one of said sections Ai.

2. The configuration of claim 1, wherein a coupling coefficient $$K_i = \frac{L_{Ai \leftrightarrow C3}}{\sqrt{L_{Ai} L_{C3}}}$$

is larger than 0.01, wherein $L_{Ai}$ characterizes a self-inductance of said section Ai and $L_{C3}$ characterizes a self-inductance of said additional current path.

3. The magnet configuration of claim 1, wherein said radially inner partial coil system and said radially outer partial coil system have dipole moments approximately equal in value and opposite in sign.

4. The magnet configuration of claim 1, further comprising means for high-resolution magnetic resonance spectroscopy.

5. The magnet configuration of claim 1, wherein said additional current path comprises a coil system which is not electrically connected to the magnet coil system and which is arranged coaxially thereto.

6. The magnet configuration of claim 1, wherein said additional current path is defined by a part of the magnet coil system, bridged with an additional switch.

7. The magnet configuration of claim 1, wherein said additional current path has a small ohmic resistance R3.

8. The magnet configuration of claim 7, wherein $L_{C3}$/R3 $\geq$ 1s with $L_{C3}$ being a self-inductance of said additional current path.

9. The magnet configuration of claim 1, wherein said additional current path is superconducting.

10. The magnet configuration of claim 1, wherein said additional current path comprises a device for limiting a current induced therein.

11. The magnet configuration of claim 1, wherein said additional current path further comprises means for drift compensation of the magnetic field of the magnet configuration in the working volume.

12. The magnet configuration of claim 1, wherein said additional current path further comprises means for shimming the magnet configuration.

13. The magnet configuration of claim 1, wherein said additional current path further comprises means for compensating external magnetic field fluctuations in the magnet configuration.

14. The magnet configuration of claim 1, wherein said additional current path is inductively decoupled from the magnet coil system.

15. The magnet configuration of claim 1, wherein at least one said inductively coupled section Ai having an inductive coupling to said additional current path which is substantially different from zero, also has a magnetic dipole moment substantially different from zero, wherein a current which is induced in said additional current path in case of a quench of said inductively coupled section, produces a magnetic dipole moment which corresponds substantially to that of said inductively coupled section before the quench.

16. The magnet configuration of claim 1, wherein said additional current path is superconducting and is thermally decoupled from at least one of said sections.

17. The magnet configuration of claim 16, wherein in case of a quench in said thermally decoupled section, an amount of heat transferred to said additional current path is not more than 50% of an amount of heat which is required for triggering a quench in said additional current path.

18. The magnet configuration of claim 1, wherein said additional current path is superconducting and thermally coupled with at least one of said sections.

19. The magnet configuration of claim 18, wherein heat transferred to said additional current path during a quench in said thermally coupled section corresponds to at least twice an amount of heat required for triggering a quench in said additional current path.

20. The magnet configuration of claim 1, wherein a substantial portion of at least one of said sections comprises only windings of said radially inner partial coil system or windings of said radially outer partial coil system.

21. The magnet configuration of claim 20, wherein said substantial portion is equal to said section.

22. The magnet configuration of claim 1, further comprising a passive magnetic material shielding.

23. The magnet configuration of claim 22, wherein said passive shielding is an integral component of a cryostat in which the magnet coil system is located.

24. The magnet configuration of claim 22, wherein said passive shielding is not completely magnetically saturated during operation.

25. The magnet configuration of claim 22, wherein said passive shielding comprises at least one of ferromagnetic material and soft iron.

26. The magnet configuration of claim 22, wherein said passive shielding is disposed radially beyond a radially outermost winding of the magnet coil system.

* * * * *